United States Patent [19]

Jordan

[11] 4,056,699
[45] Nov. 1, 1977

[54] TOUCH PLATE ASSEMBLY

[75] Inventor: Leslie S. Jordan, Logansport, Ind.

[73] Assignee: Essex International, Inc., Fort Wayne, Ind.

[21] Appl. No.: 631,596

[22] Filed: Nov. 13, 1975

[51] Int. Cl.² .............................................. H01H 9/26
[52] U.S. Cl. .............................. 200/5 A; 200/DIG. 1
[58] Field of Search ..................... 200/52 R, 292, 310, 200/311, 312, 313, 314, 317, DIG. 1, 159 B, 5 A, 5 D, 159 A; 317/DIG. 2, 101 CC, 101 CE, 101 CM; 340/365 C

[56] References Cited

U.S. PATENT DOCUMENTS

| 3,492,440 | 1/1970 | Cerbone et al. ................... 200/52 R |
| 3,591,749 | 7/1971 | Comstock ........................... 200/292 |
| 3,623,127 | 11/1971 | Glenn ........................... 317/101 DH |
| 3,696,409 | 10/1972 | Braaten ........................... 340/365 C |
| 3,732,389 | 5/1973 | Kaelin et al. ........................ 200/313 |
| 3,767,974 | 10/1973 | Donovan, Jr. et al. ............. 200/292 |
| 3,974,332 | 8/1976 | Abe et al. ........................... 340/365 C |

OTHER PUBLICATIONS

Rice, R. and Shea, J. J., "Circuit Board Assembly," IBM Technical Disclosure Bulletin, vol. 4, No. 9, Feb. 1962, p. 7.

Primary Examiner—Robert K. Schaefer
Assistant Examiner—Eugene S. Indyk
Attorney, Agent, or Firm—Lawrence E. Freiburger; Robert D. Sommer

[57] ABSTRACT

A touch plate assembly for a digital control device. The touch plate is sectioned off into a plurality of touch switch areas, each of which represents certain information to be entered into the control circuit. The touch plate and a printed circuit board, carrying the detection circuitry are held in place by a housing which may carry other circuitry as well. Electrical connections between the detection circuitry and the touch switches are made by resilient spring contact members rigidly mounted on the circuit board and soldered in place as a component. A combination shield-filter assembly is bonded to the back of the touch plate. The shield-filter assembly includes a metal-polyester laminate having windows therein, through which the spring contact members make electrical contact to contact areas on the touch plate. In addition, certain portions of the metal layer are removed so that light from a light source located on the printed circuit board may be seen by the user of the control.

7 Claims, 6 Drawing Figures

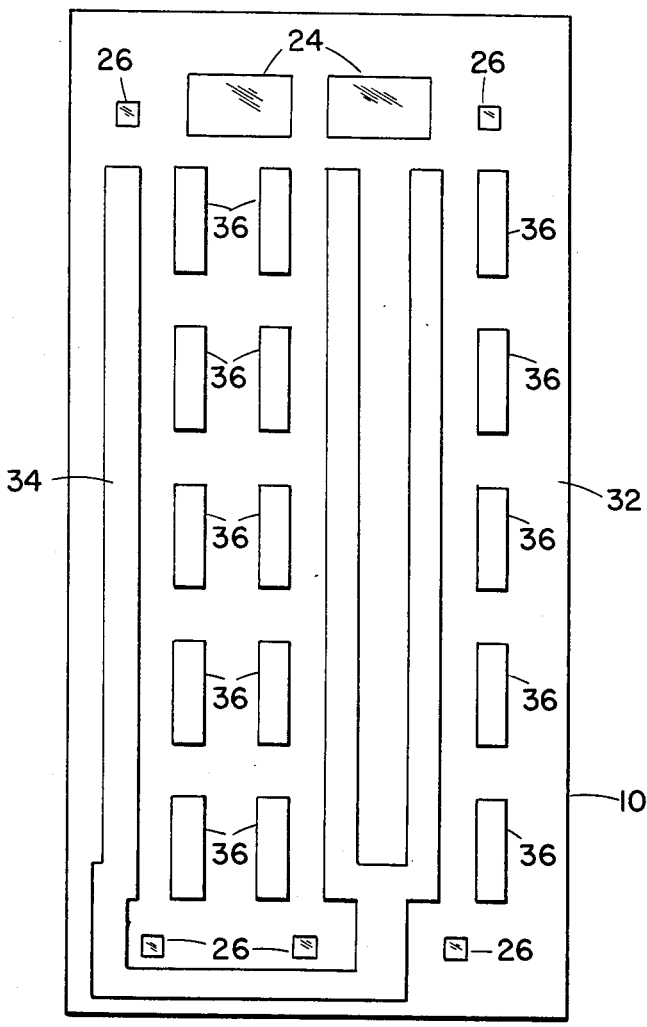
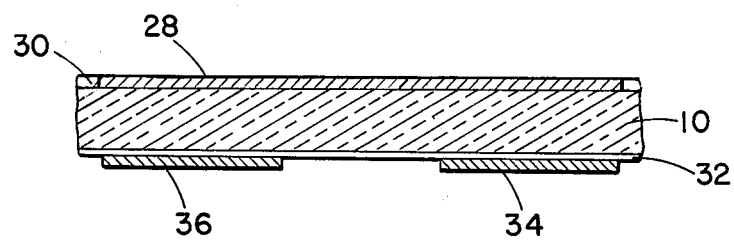

TOUCH PLATE ASSEMBLY

BACKGROUND OF THE INVENTION

With the advent of electronic controls for such appliances as microwave ovens, ranges, and clothes washers has come the need for a simple method of entering information into the control. The keyboard has fulfilled such a need by allowing a user to enter information by depressing a series of push button switches. However, the keyboard is not entirely desirable in certain instances, especially in appliances, because water and other foreign matter can collect on the surface of the keyboard as well as enter into the inside of the keyboard. To overcome the problems associated with mechanical keyboards, electronic keyboards, sometimes known as "touch plates" have been developed. A touch plate is generally sectioned off into a plurality of areas each representing certain information to be entered into the control, by touching that particular area.

In the prior art, touch plates have generally formed a part of the cabinet for the appliance with which it is used. In one of the problem areas with prior art touch plate assemblies, breakage of the touch plate glass has resulted in exposing the concealed wiring of the appliance. Therefore, in the prior art, breakage of the touch plate has resulted in a potentially dangerous shock hazard.

One method of overcoming this breakage problem has been to temper the glass so as to make it stronger. However, tempering the glass has only been effective for glass plates having a relatively large area. The problem of glass breakage of touch plates having relatively small area remains unsolved.

SUMMARY OF THE INVENTION

It is an object of the present invention to provide a structure for a glass touch plate which minimizes the shock hazard in a touch plate construction, should the touch plate be broken. It is a further object of the present invention to provide a novel structure for a glass touch plate which, in addition to minimizing shock hazard, also provides a structure for preventing the transfer of spurious electrical signals from circuitry on a printed circuit board behind the touch plate and vice versa, as well as providing an optical filter for light elements on the printed circuit board which displays information to the user through windows in the touch plate.

These and other objects of the present invention are accomplished by adhering a laminate comprised of a metal layer and a layer of a preselected optical transmissivity to the back of the touch plate. Electrical connections are made from circuitry located behind the touch plate to contact areas on the back of the touch plate through windows in the laminate. Additionally, windows are provided only in the metal layer at certain locations such that light from a light source mounted on the printed circuit board behind the touch plate is filtered when viewed through the touch plate by the user.

BRIEF DESCRIPTION OF THE DRAWINGS

In the course of the description of the preferred embodiment of the present invention reference will be made to the drawings in which:

FIG. 2 is an elevational view of the underside of the touch plate for use with the present invention;

FIG. 3 is a cross sectional view taken along lines 3—3 in FIG. 1;

DESCRIPTION OF THE PREFERRED EMBODIMENT OF THE PRESENT INVENTION

Figure 1:
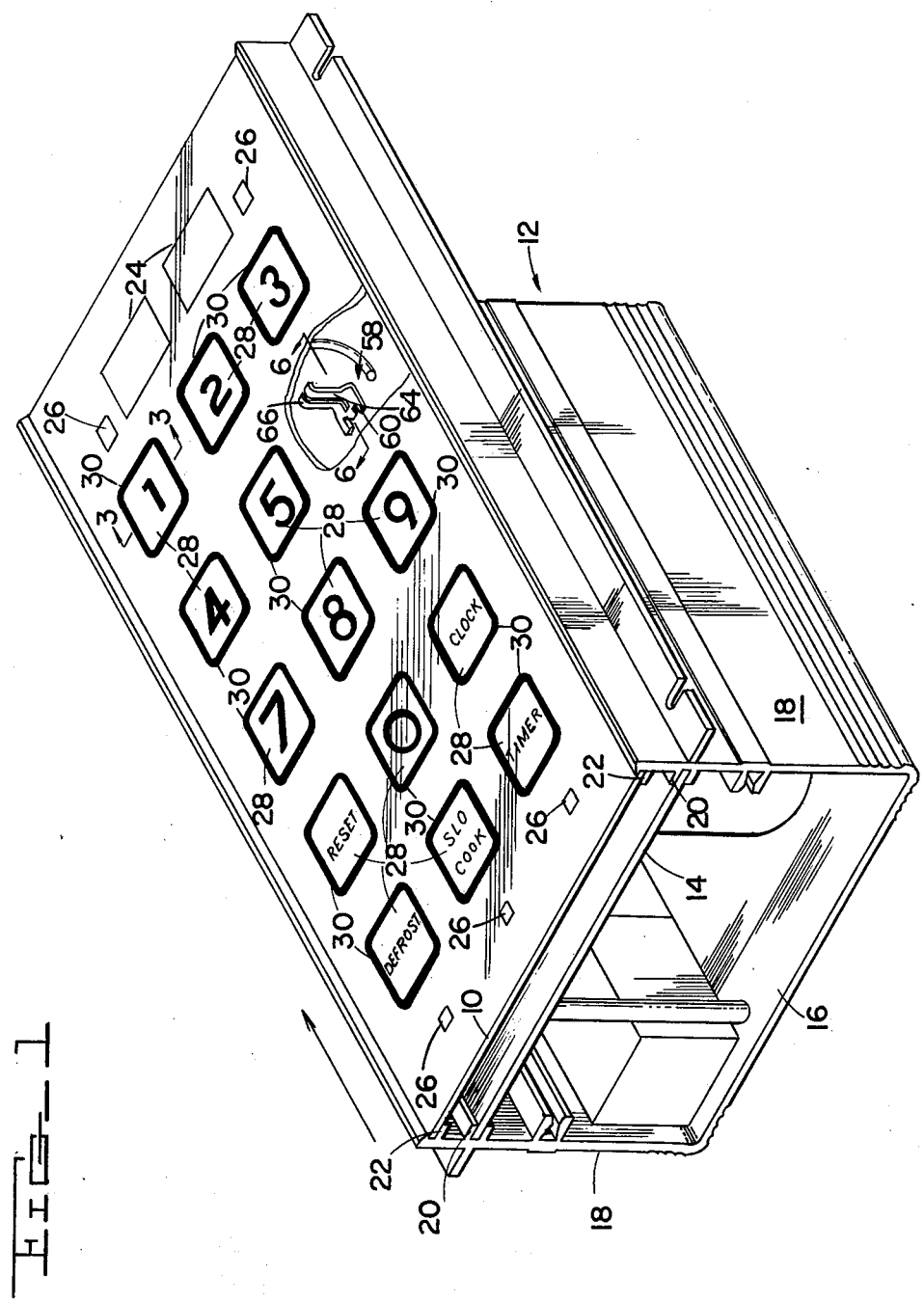
FIG. 1 is an isometric view of a touch plate and a housing therefor, in accordance with the present invention.

Referring now to FIG. 1 a touch plate 10 made of glass or other suitable dielectric material is mounted in a housing 12 which also holds a printed circuit card 14 in place. In the preferred embodiment, housing 12 is extruded from aluminum such that it has a bottom wall 16 and two upstanding sidewalls 18 extending substantially perpendicularly therefrom. Sidewalls 18 are bowed very slightly inwardly toward one another so that the edges of touch plate 10 and printed circuit 14 are frictionally engaged between mounting tabs 22 and 20 respectively. Thus, it can be seen that the printed circuit 14 and the touch plate 10 are easily installed into housing 12 by inserting them between the proper mounting tabs and sliding them into the housing.

Still referring to FIG. 1 the touch plate 10 has a plurality of electrically conductive coatings 28 thereon which each form the plate of a parallel plate capacitor as will hereinafter be described. The coatings 28 may have a border 30 surrounding them which serve to set off each of the coatings. Finally, a legend may be applied over each coating 28 to represent the particular touch switch which is actuated by touching that area.

Referring now to FIG. 2 the back of the touch plate 10 may be coated with a suitable electrically non-conductive coating 32 covering the entire backside except the area 24 which is left clear so that a digital display located on the printed circuit 14 behind the touch plate 10 may be viewed by a person operating the control through windows 24. In the same manner, windows 26 allow a person operating the control to view a single light source located on printed circuit board 14.

Over the electrically non-conductive coating 32 is a first electrically conductive coating 34 which includes three generally parallel strips which are electrically connected together at the bottom. A plurality of spaced apart conductive coatings 36 are also located on the backside of the touch plate. It will be seen from FIG. 3, that the glass 10 of the touch plate forms a dielectric for a plurality of pairs of series connected parallel plate capacitors. Still referring to FIG. 3 it can be seen that conductive coating 36 forms a parallel plate capacitor with each conductive coating 28, and each conductive coating 34 also forms a parallel plate capacitor with coating 28. Thus, each of the areas representing information to be entered into the control has a pair of serially connected capacitors associated with it.

Figure 4:
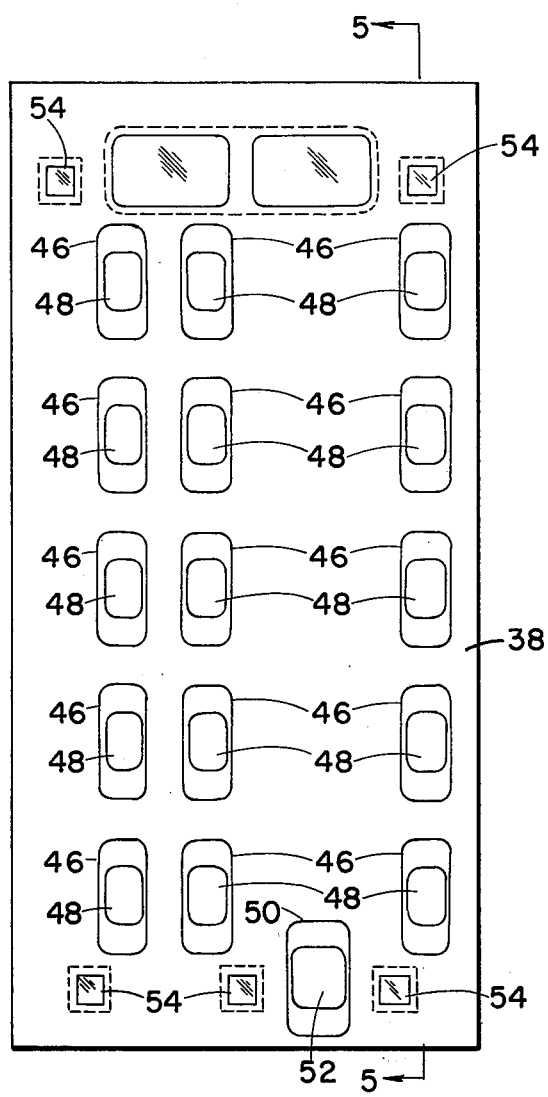
FIG. 4 is an elevational view of a combination touch plate shield and filter assembly in accordance with the present invention.
Figure 5:
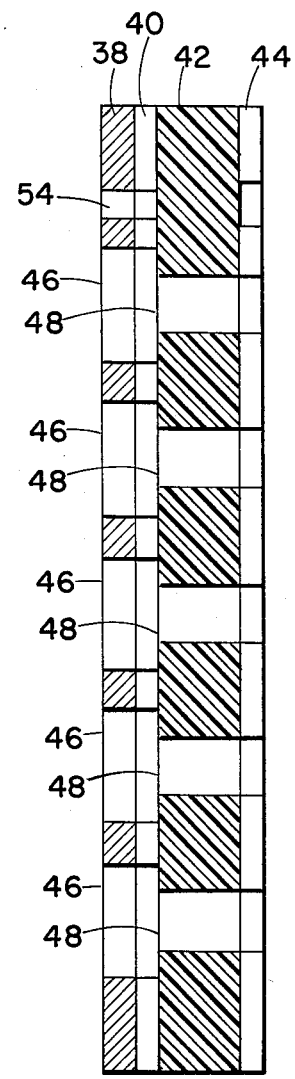
FIG. 5 is a cross sectional view taken along line 5—5 of FIG. 4.

Referring to FIGS. 4 and 5 the combination shield-filter assembly for use with a touch plate in accordance with the present invention essentially includes an aluminum layer and a polyester layer bonded to one another with portions of each layer selectively removed so as to allow electrical connections to be made to the contact areas on the back of the touch plate and to provide an optical filter for light sources on the printed circuit. The shield-filter assembly is preferably comprised of an aluminum layer 38 which is bonded by suitable adhesive means 40 to a polyester material 42 having a predetermined transmission wavelength. Adhesive means 44 is provided on the back of polyester 42 for attaching the combination shield-filter assembly to the back of the touch plate 10. Preferably, adhesive 44 is a contact adhesive but other adhesives may be used as well. A plurality of windows or cutouts 46 are provided in the aluminum layer 38 and a plurality of windows or cutouts 48 are provided in the polyester layer 42 so as to expose the conductive coatings 36 for the purpose of making electrical contact thereto. In the same manner, a window or cutout 50 in the aluminum layer 38 surrounds a window or cutout 52 in the polyester layer 42 so as to expose a portion of conductive coating 34 for the purpose of making electrical connections thereto. Additionally, a plurality of windows or cutouts 54 are selectively provided in the aluminum layer only so as to expose the transparent polyester layer 42. Inasmuch as the cutouts 54 are aligned with the transparent areas 26 in the paint 32 on the touch plate, it can be seen that the light from a light source located on the printed circuit 14 will be optically filtered by the polyester layer 42 when observed by a person using the touch plate.

In practice, it has been found that a suitable glass for the touch plate is conventional soda lime glass. A suitable paint for the paint 32 may be any conventional paint which is electrically non-conductive and which adheres to the soda lime glass such as an epoxy or acrylic base paint. It has been found that the material 34 and 36 on the back of the touch plate can be any electrically conductive coating which may be applied to the back of the touch plate by a silk screening process or by other conventional processes. On the front of the touch plate, the conductive areas 28 are preferably formed by conventionally silk screening a tin oxide coating thereon.

For the combination shield-filter assembly, it has been found that layer 38 may be formed from a 3 mil thick aluminum sheet. Further, the polyester layer 42 may be a 7 mil thick polyester film with a transmission wavelength of approximately 6500 A if it is desired that the displays and the indicator lights appear red to the user. Of course, other films with other transmission wavelengths may be used, if desired, the adhesive used to bond the aluminum to the polyester layer may be any adhesive suitable for that purpose. As was stated above, the adhesive 44 is preferably a contact adhesive which will bond the polyester film to the paint on the back of the touch plate.

Figure 6:
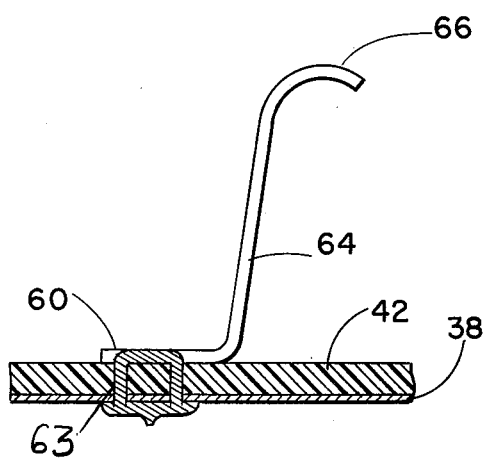
FIG. 6 is a cross sectional view taken along line 6—6 of FIG. 1.

Referring back to FIG. 1, electrical contact from the printed circuit 14 to the contact areas 34 and 36 on the back of the touch plate are made by a plurality spring contact member generally indicated by reference numeral 58, which is formed from a suitable electrically conductive metal which can be formed easily but which retains its resiliency, once it is formed. Such a spring contact may be constructed of a phosphor bronze material. It will be understood that there is one such spring contact for each conductive contact area 36 and one for the conductive contact area 34, as well as one for the aluminum sheet 38 for grounding purposes. Referring to FIG. 6, each spring contact 58 includes a base portion 60 which lies flat against the surface of printed circuit board 14. A pair of connection tabs 62 extend downwardly from the base portion through a thruhole 63 in the printed circuit and solder connections are made to the tabs 62 in the same manner as a conventional component on the printed circuit board. The spring contact member 58 also includes a bifurcated contact portion comprising a pair of resilient fingers 64 which extend upwardly away from the printed circuit board 14 toward the underside of the touch plate 10. The ends of fingers 64 are bent downwardly so as to form a camming surface 66 which cams along the undersurface of the touch plate - shield-filter assembly when it is inserted into the housing in the direction indicated by the arrow on FIG. 1. When the touch plate and housing are properly aligned, it can be appreciated that the camming surface 66 of each spring contact member 58 will abut against one of the conductive areas 36 or against the conductive area 34, thus completing a conductive path from the printed circuit to the conductive area on the touch plate.

It will be appreciated by those skilled in the art that the touch plate assembly is easily assembled with a minimum amount of time and labor. In assembling this touch plate assembly, the larger components such as transformers and other components requiring heat sinking are mounted inside the aluminum extrusion 12 by conventional means. Secondly, the printed circuit card 14 is inserted between the mounting tabs 20 by spreading the walls 12 and sliding the printed circuit board into the housing in the direction indicated by the arrow in FIG. 1. The touch plate with the shield-filter assembly attached to the underside is then inserted between mounting tabs 22 and inserted in the direction indicated by the arrow in FIG. 1. Inasmuch as the walls 18 of the housing are slightly bowed inwardly, it will be appreciated that both the printed circuit card 14 and the touch plate 10 will be frictionally engaged and held in the housing. If desired, a suitable cement may be placed along the mounting tabs 20 and 22 to insure that the printed circuit and the touch plate are held in place.

The combination shield-filter assembly for use with the touch plate not only provides an electrical shield which minimizes the transfer of spurious electrical signals from the touch plate to the circuitry on the printed circuit board and vice versa, and an optical filter for light sources located on the printed circuit, but also suprisingly provides a means for minimizing electrical shock hazard. Inasmuch as the shield-filter assembly is bonded to the back of the touch plate, it has been found that it prevents the removal of broken pieces of glass if the touch plate is broken. Additionally, even if the touch plate is broken and pieces of glass are removed, the shield-filter assembly which remains still minimizes electrical shock by preventing a person from inserting his fingers into the printed circuit.

While a specific example of the present invention has been disclosed, obvious variations will occur to those skilled in the art. Therefore, it is intended that the invention be defined in the appended claims.

What is claimed is:

1. A touch plate assembly for entering information into a digital control circuit, comprising:
  a flat dielectric plate having front and back faces;
  a plurality of touch switches on said plate, each said touch switch including a first electrically conductive area on the front face of said dielectric plate representing certain information to be entered into said control circuit, and spaced apart input and output electrically conductive contact areas on the back face of said plate, said input and output contact areas underlying said first electrically conductive area;

a printed circuit board containing circuitry for detecting the activation of said touch switches;

housing means for holding said dielectric plate and said printed circuit board substantially parallel to one another;

resilient electrical contact means for making electrical contact from the circuitry on said printed circuit board to each input and output conductive contact area, said resilient electrical contact means comprising a plurality of resilient bifurcated contacts extending from said printed circuit board toward said dielectric plate, each said bifurcated contact abutting against one of said contact areas to make electrical contact thereto.

2. The touch plate assembly as claimed in claim 1, further comprising:

a laminate bonded to the back face of said dielectric plate, said laminate having a plurality of apertures therein through which said bifurcated contacts extend.

3. The assembly as claimed in claim 2, wherein said laminate is comprised of a metal layer and a polyester layer.

4. In a touch plate assembly including an imperforate glass plate having a plurality of touch switches thereon, circuit means located behind said touch plate exposing a potential shock hazard should the touch plate be broken and generating spurious electrical signals, resilient electrical contact means for making electrical contact from said circuit means to said touch switches, and display means located behind said touch plate to be seen by a touch plate operator through windows in a coating on a touch plate, means for minimizing the shock hazard if the touch plate is broken, comprising:

a combination electrical shield-optical filter subassembly comprising a metal-plastic laminate bonded to the backside of the touch plate, the metal layer of said laminate having portions thereof selectively removed so as to provide windows therein aligned with the windows in the coating on the touch plate through which the operator views said displays.

5. A touch plate assembly for entering information into a digital control circuit, comprising:

a flat dielectric plate having front and back faces;

a plurality of touch switches on said dielectric plate;

contact areas on said back face, said contact areas being electrically connected to said touch switches;

a printed circuit board containing circuitry for detecting the activation of said touch switches;

a plurality of bifurcated contacts extending from said printed circuit board toward said dielectric plate, said bifurcated contacts being electrically connected to said circuitry and abutting against said contact areas to electrically connect said circuitry and said touch switches;

housing means for holding said dielectric plate and said printed circuit board substantially parallel to one another, said housing means including first means for engaging a first edge of said flat dielectric plate and a first edge of said printed circuit board, and second means for engaging the opposite edge of said flat dielectric plate and the opposite edge of said printed circuit board.

6. The touch plate assembly as claimed in claim 5, further comprising:

resilient means for normally urging first and second engaging means toward one another.

7. The touch plate assembly as claimed in claim 2 wherein said dielectric plate is constructed of relatively rigid breakable material.

* * * * *